United States Patent [19]
Britt

[11] Patent Number: 5,406,837
[45] Date of Patent: Apr. 18, 1995

[54] VEHICLE TESTING DEVICE AND METHOD

[75] Inventor: John C. Britt, High Point, N.C.

[73] Assignee: Bal-Jetta Systems Co., Inc., High Point, N.C.

[21] Appl. No.: 280,127

[22] Filed: Jul. 25, 1994

[51] Int. Cl.$^6$ ............................................. G01L 1/02
[52] U.S. Cl. .................................... 73/121; 73/129; 73/132
[58] Field of Search ........................ 73/121, 129, 132

[56] References Cited

U.S. PATENT DOCUMENTS

| | | | |
|---|---|---|---|
| 3,824,847 | 7/1974 | Chambers | 73/132 |
| 4,050,298 | 9/1977 | Hope et al. | 73/121 |
| 4,771,387 | 9/1988 | Hexel et al. | 73/121 |
| 4,935,047 | 6/1990 | Wu | 403/31 |

Primary Examiner—Richard E. Chilcot, Jr.
Assistant Examiner—Max H. Noori

[57] ABSTRACT

A vehicle testing device and method are provided whereby a mechanic can easily test the pneumatic brake system of a tractor, converter dolly and trailer. In addition, electrical circuitry is supplied to allow the mechanic to check the electrical circuits from the tractor to the trailer which supply power for the turn signals, brake lights, clearance lights, auxiliary lights and turn signals. The testing device is compact and portable and affords a mechanic a convenient tool for efficiently carrying out the necessary safety tests on both the tractor and trailer which may be disconnected at the time the testing occurs.

21 Claims, 3 Drawing Sheets

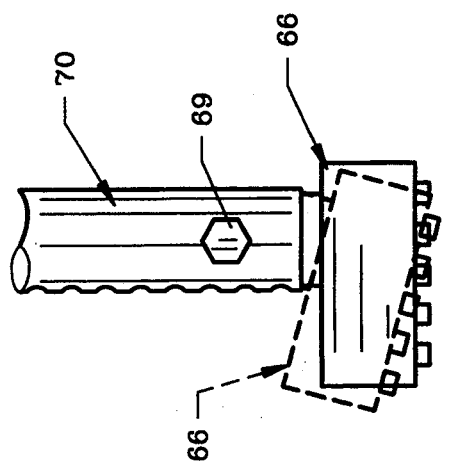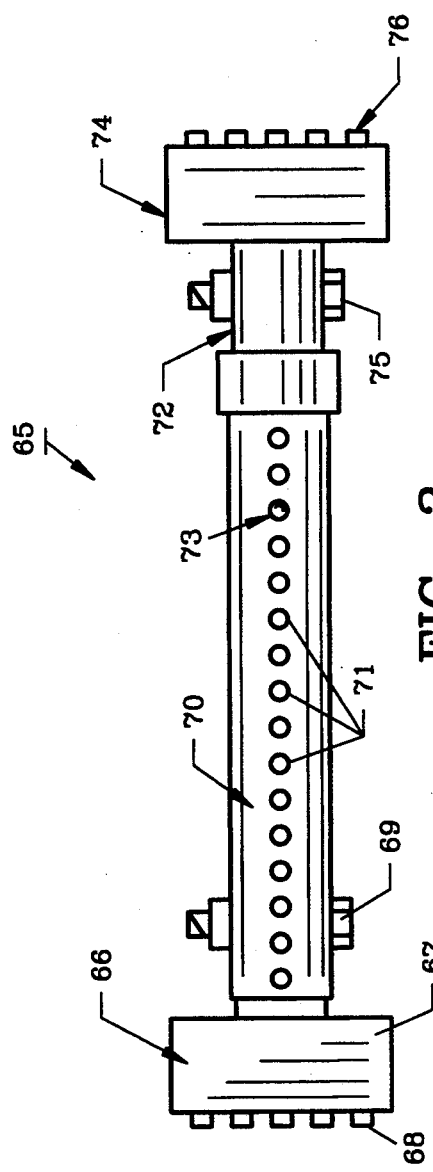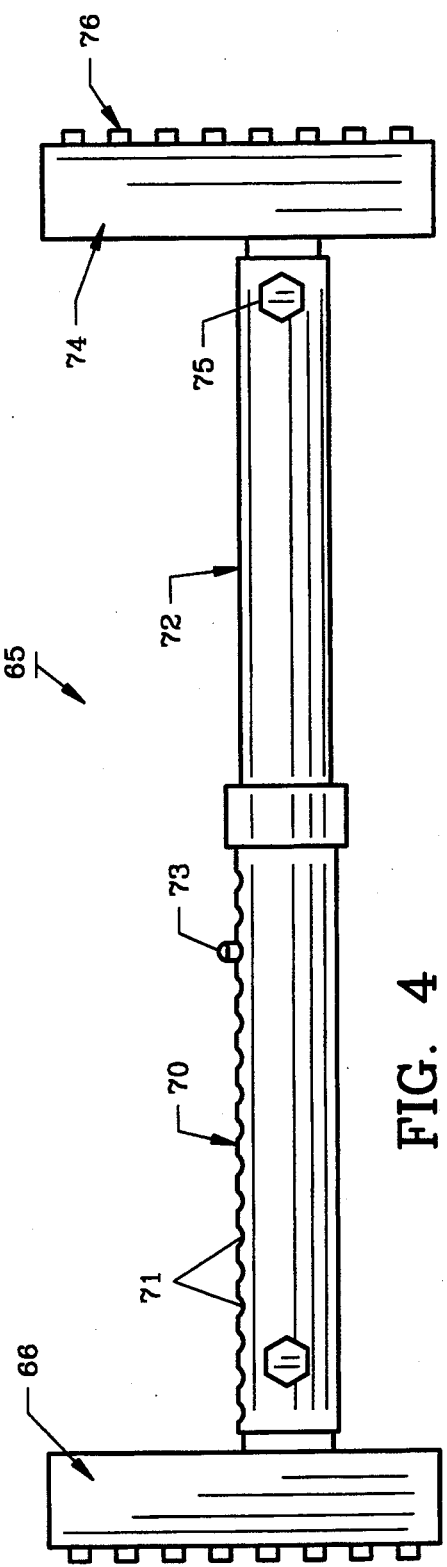

VEHICLE TESTING DEVICE AND METHOD

BACKGROUND OF THE INVENTION

1. Field Of The Invention

The invention herein pertains to a device and method for testing the pneumatic brakes of tractor-trailers as used for commercial hauling. The testing equipment herein is useful for trucking companies, D.O.T. officials, and others that must periodically inspect the brake and electrical light systems of trucks and trailers.

2. Description Of The Prior Art And Objectives Of The Invention

Safety is a primary concern of the U.S. Department of Transportation (D.O.T.), trucking companies and all personnel associated therewith. Tractor-trailers are responsible for transporting most of the goods in the United States and other countries and the pneumatic braking systems which are employed must be frequently tested along with the turn signals, brake lights, auxiliary lighting, clearance lighting, and tail lights to insure a safe vehicle. Over the years mechanics have developed various systems to correctly and efficiently test and repair the pneumatic and electrical light circuits of tractor-trailers but many of the test procedures require two men. As such, the cost of frequent inspections for tractor-trailers has greatly increased in some cases, therefore putting the drivers, other motorist and property at risk as fewer inspections and tests are undertaken. Heretofore a single mechanic would have difficulty in checking, for example, the brake system beneath the tractor or trailer while holding the brake pedal depressed and would likewise have difficulty in observing the brake lights at the rear of the trailer from a position inside the cab. In addition, it has been difficult in the past to check the electrical light circuits of a trailer if unattached from tractor because power must be supplied to the trailer electrical circuitry for a visual inspection.

For this and other reasons the present invention was conceived and one of its objectives is to provide a method and testing apparatus for a tractor-trailer which will allows a sole mechanic to check the brake systems of tractors and certain trailers with accuracy.

It is another objective of the present invention to provide a means for a single mechanic to check the electrical light circuitry of a tractor and a trailer even when the tractor and trailer are disconnected and parked at separate locations with accuracy.

It is also an objective of the present invention to provide a method for testing the pneumatic system as well as the electrical light system of tractor-trailers by a single mechanic with improved efficiency, convenience and accuracy.

It is yet another objective of the present invention to provide a device to maintain a brake pedal in a depressed posture to allow the mechanic to leave the tractor cab and visually inspect beneath the tractor-trailer for air leaks, frayed or damaged air lines and components while the brake pedal remains depressed.

It is still another objective of the present invention to provide a testing device whereby the outside electrical lights and pneumatic brake systems are quickly and easily checked to determine if any defects exist or if repairs are necessary.

It is yet still another Objective of the present invention to provide a device for testing electrical light circuitry and pneumatic brake systems of tractor-trailers which includes a compact, easily portable housing containing electrical circuitry with pneumatic fittings and easily visible gauges and lights thereon.

It is a further objective of the present invention to provide a testing device and method for tractor-trailers which includes a metal housing having a pair of battery connections for testing certain electrical circuitry of trailers while disconnected from the electrical supply of the tractor by applying proper voltage to the battery connections with accuracy.

Various other objectives and advantages of the present invention will become apparent to those skilled in the art as a more detailed description is set forth below.

SUMMARY OF THE INVENTION

The aforesaid and other objectives are realized by providing a device and method for quickly testing certain electrical light circuits of a tractor and trailer by a sole mechanic. The conventional electrical pigtail from the tractor can be connected to the test device and the turn signal, brake light, auxiliary light, clearance light, ground and tail light circuits of the tractor can be checked by turning on the various tractor dashboard switches. With the trailer disconnected mechanically and electrically from the tractor, the testing device can also be used to check the same light circuitry of the trailer by applying battery power to the device through convenient battery connections thereon. Switches on the housing of test device act as substitute switches for the tractor switches for the various light circuits. The testing device is lightweight and easily portable and can be carried from vehicle to vehicle with relatively ease with accurate test capability.

In addition to testing the light circuitry as mentioned above, the pneumatic or brake systems can likewise be tested since the device includes a pair of pneumatic connections and gauges for respectively observing the pneumatic pressure of the brake systems. Both the service and emergency pneumatic systems can be checked and thereafter appropriate repairs made as required. The emergency connection on the testing device includes a check valve to release air pressure to simulate a ruptured air line for checking the tractor protection valve. The tractor pneumatic brake system can be tested by connecting the tractor glad hands (connections) to the testing device. Also, trailers of the tandem (double) type when pneumatically connected to the tractor can be checked as they provide available rear glad hand connectors for coupling to the trailing trailer. The trailing trailer electrical lighting system can also be checked.

In order to check the brake system the brake pedal must be depressed and the testing device therefore can be used in combination with an adjustable, elongated device as hereinafter more fully described which can be positioned between the brake pedal and the tractor seat or other rigid structure within the cab. This device allows the mechanic to depress the brake pedal, exit the tractor cab and move beneath the tractor and/or trailer while the pedal remains depressed to visually and audibly inspect the brake lines, fittings and components and for proper brake adjustment.

BRIEF DESCRIPTION OF THE DRAWINGS

FIG. 3 demonstrates an elongated device of the invention for depressing a vehicle pedal during testing;

FIG. 4 shows an extended side view of the device as shown in FIG. 3; and

FIG. 5 shows a fragmented view of one elongated device support to demonstrate the pivotal action provided.

DETAILED DESCRIPTION OF THE PREFERRED EMBODIMENT AND OPERATION OF THE INVENTION

Figure 1:
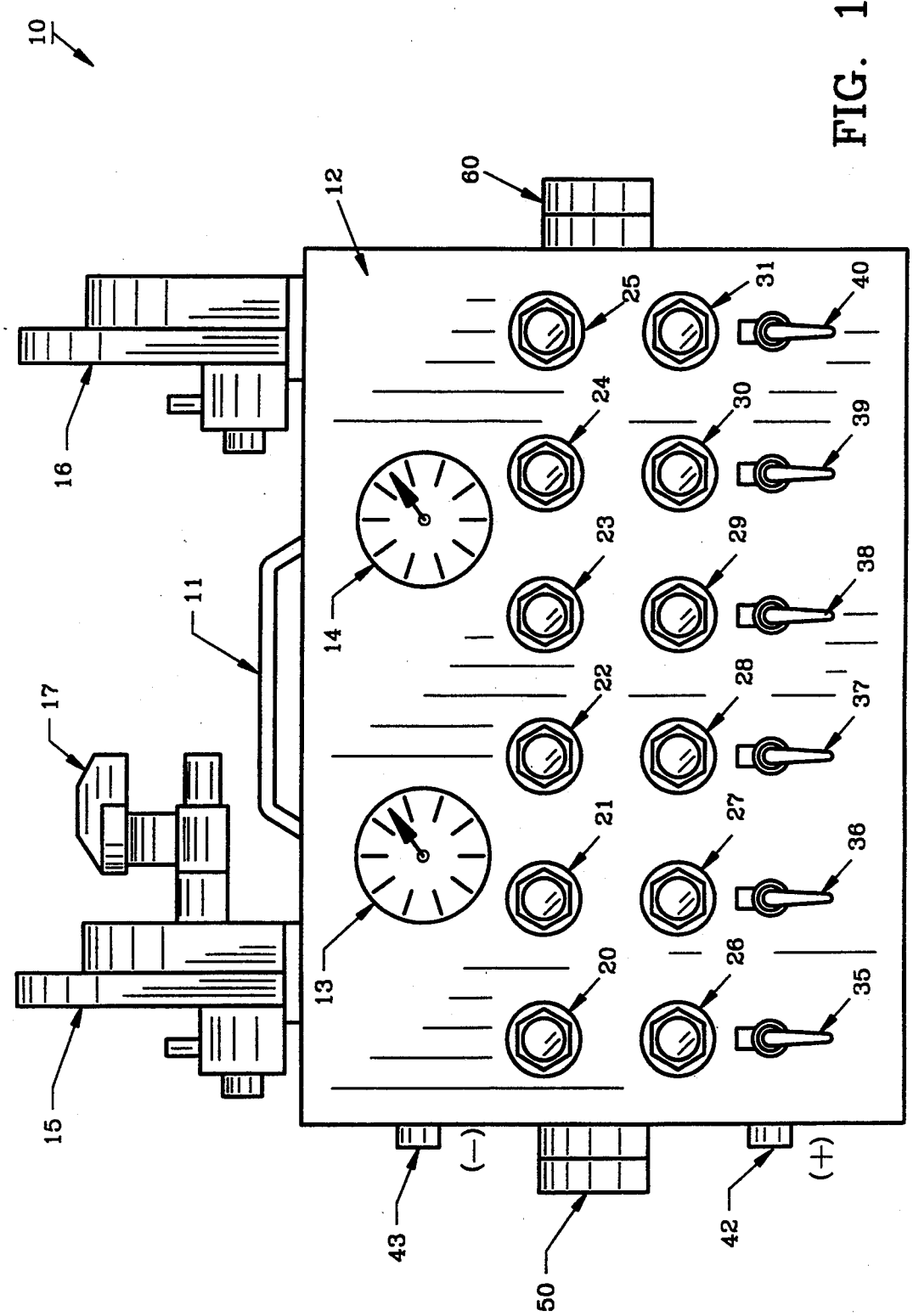
FIG. 1 shows a front elevational view of the vehicle testing device of the invention without tractor-trailer pneumatic or electrical lines connected thereto.

For a detailed description of the invention and its method of operation, turning now to the drawings, FIG. 1 shows a frontal view of the housing of the preferred embodiment of vehicle testing device 10 as would be used to check certain electrical light circuits of a conventional tractor and trailer (not shown). Device 10 is also used to check the pneumatic brake systems of the tractor and trailers and as seen, includes handle 11 for convenience in carrying by a mechanic. Handle 11 is affixed to housing 12 which may consist of a rectangular box formed of thin sheet metal or other suitable materials. Housing 12 contains pneumatic pressure gauge 13 for connection to the "emergency" tractor or trailer pneumatic line and pressure gauge 14 is connected to the service or "application" brake lines as will be hereinafter more fully described. Gauge 13 is in fluid communication with emergency glad hand connection 15 whereas gauge 14 is in fluid communication with application glad hand connection 16 shown atop housing 12 in FIG. 1. ConneCtions 15 and 16 are conventional connections for coupling to the pneumatic lines from the tractor and/or trailer as required. Glad hand connection 15 has manually operated check valve 17 which can be used to emulate a ruptured pneumatic line during testing to check the tractor protection valve. Testing device 10 can be connected for pneumatic and electrical testing to tractors and/or trailers of the "tandem" type which have rear pneumatic couplings and electrical connections, provided the tandem trailer is pneumatically and electrically joined to the tractor for an accurate test of both the braking system and lighting. Converter dollies are used between tandem type trailers.

Figure 2:
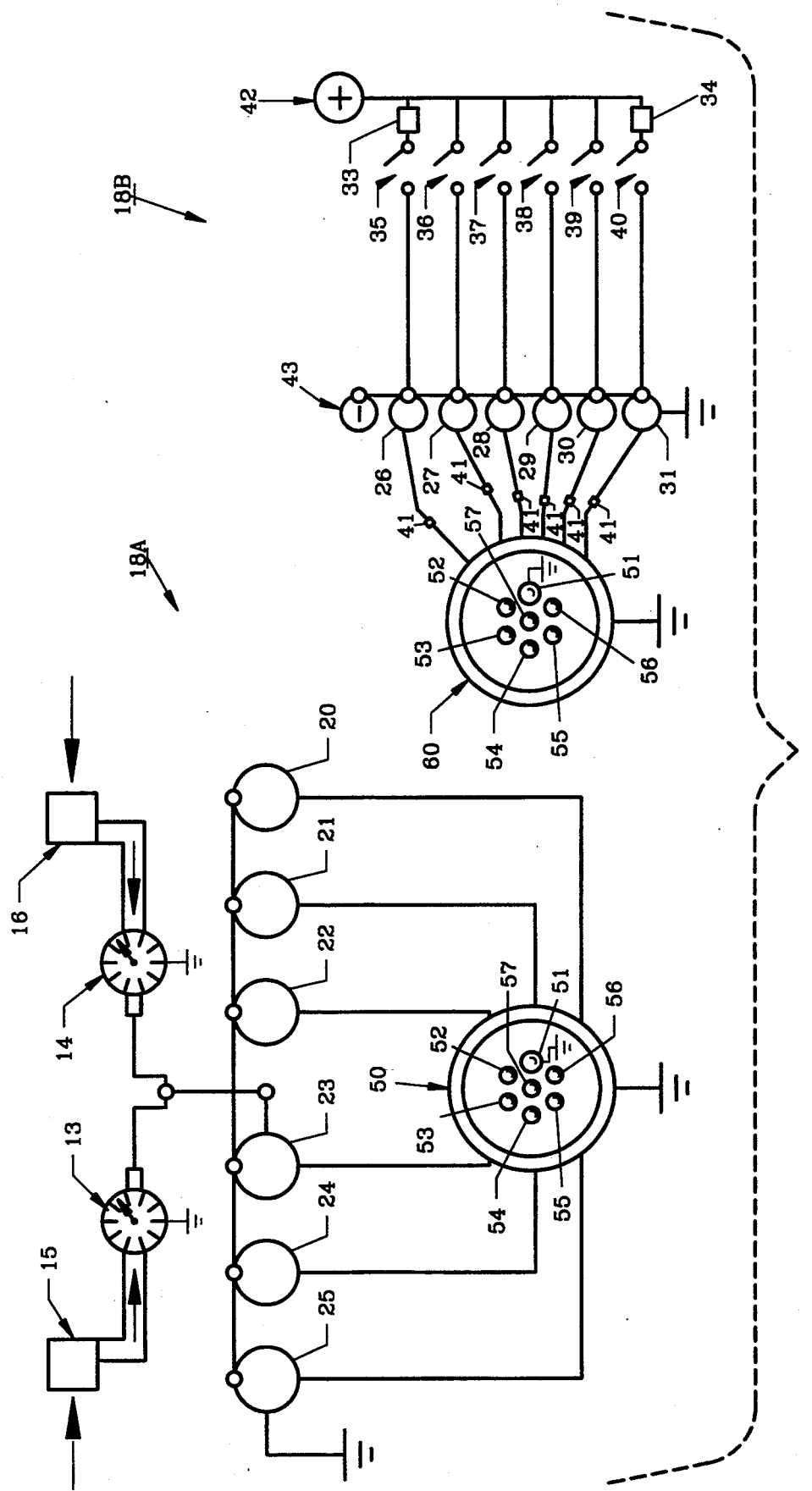
FIG. 2 illustrates the electrical and pneumatic circuitry of the testing device.

Housing lights 20-31 are substantially low voltage lights although LED's or the like may also be used. As shown in FIG. 2, lights 26 and 31 having flashing circuitry 33, 34 respectively connected thereto as will be hereinafter more fully explained. Switches 35-40 are connected respectively to lights 26-31 as also seen in FIG. 2. In FIG. 1, power can be applied to circuitry 18B of FIG. 2 by connecting a standard 12 volt storage battery to negative pole 43 and positive pole 42. Negative pole 43 and positive pole 42 are used for checking the light circuitry of a trailer when it is has been detached from the tractor and no power connected to the trailer from the tractor.

In use for checking tractor wiring and switches, the electrical tractor pigtail (not shown) is inserted into electrical connection 50, which as shown in FIG. 2 (circuitry 18A), includes seven probes, specifically ground probe 51, left turn signal probe 55, brake light probe 54, auxiliary light probe 57, clearance light probe 56, tail light probe 52 and right turn signal light probe 53 which engages mating circuits of the tractor pigtail. With the electrical light circuitry of a trailer separated (electrically disconnected from the tractor) to check, 12 volt battery power is applied to positive pole 42 and negative pole 43 on testing device 10. As seen in FIG. 2, circuit 18B the trailer pigtail (not shown) is inserted into electrical connection 60 and switches 35-40 can thus be manually activated with the pigtail from the trailer joined to electrical connection 60. Connection 60 is equipped with circuit breakers 41. Switches 35-40 are turned on to,simulate the appropriate tractor cab switches for example, left and right turn signals, brake lights, auxiliary lights, clearance lights and tail lights of the trailer. With switches 35-40 turned on, a mechanic can easily verify whether or not the respective lights on the trailer are on and operational, if not, make appropriate replacements or repairs. As would be understood, flasher circuits 33 and 34 allow the left and right turn signal light to flash as would occur under normal operating conditions.

When checking the brake pneumatic system and brake lights, especially when a mechanic is working alone, adjustable, elongated device 65 as shown in FIGS. 3, 4 and 5 can be of great assistance. As seen, device 65 includes a first support 66 which consists of a pad 67 having a rubber tread 68 affixed thereto for friction producing purposes. Support 66 is rectangular in shape and will pivot as shown in FIG. 5 around threaded member 69. Support 66 is positioned within first, large tubular member 70 which defines a series of apertures 71 therealong for adjustment purposes. Smaller diameter second tubular member 72 telescopingly fits within first tubular member 70. First tubular member 70 may for example have an outside diameter of one inch (2.54 cm) and second tubular member 72 may have an outside diameter of three-quarters of an inch (19.05 cm). As shown in FIG. 4, second tubular member 72 is extended from first tubular member 70 and lock pin 73 which is spring-loaded on second tubular member 72 extends through one of apertures 71 on first tubular member 70 to hold the second tubular member 70 fixed relative thereto. Second rectangular support 74 is likewise pivotally mounted by threaded member 75 to second tubular member 72. Second support 74 likewise includes a rubber tread 76 affixed thereto. In operation, the mechanic can place first support 66 against the brake pedal, extend second tubular member 72 a desired distance, and then frictionally engage second support 74 against the driver's seat or some other fixed object in the tractor cab. The pivoting action of ifirst support 66 as shown in FIG. 5 provides convenience in adjusting and placing elongated device 65 during operation. With the brake pedal so depressed, the hydraulic brake system or air brake system can be inspected and checked, brake lights checked and adjustments made without the need for a second mechanic to assist the first mechanic.

In order to check the pneumatic brake system of a tractor or a trailer of the tandem type (multi-trailer type), testing device 10 can be of great assistance. As would be understood, a conventional tractor includes (1) a manual (red) emergency valve button (park brake) on the cab dash for the trailer, (2) a manual (yellow) valve button (park brake) on the cab dash for the tractor which is pneumatically connected to the red emergency valve, (3) a hand brake valve contiguous to the tractor cab hand brake, (4) a foot brake valve contiguous to the foot brake pedal and (5) a tractor protection valve which is normally located exteriorly of the cab, usually on the back side thereof. Conventional tractor-trailer park brakes are operated by positive spring tension whereupon the pneumatic pressure components (normally active) lessen the spring tension, thus allowing the vehicle to move. In the event pneumatic pressure is terminated, as by an air line rupture of a trailer having typical spring brake chambers, the spring tension immediately applies brakes at each wheel having such spring brake chambers. The (red) emergency valve button must be depressed for the trailer if connected to the tractor to move and the (yellow) valve button must be pressed in for the tractor to move. Colors herein mentioned are standard in the industry. The conventional hand and foot brake valves are operated by the driver during operation as necessary. Testing device 10 can thus be used to check the pneumatic system of the tractor or a tractor-trailer combination when the trailer is of the tandem type having one, two or sometimes three trailers.

The method of testing the pneumatic system comprises joining the emergency and application lines of for example, the tractor to respectively emergency glad hand connection 15 and application glad hand connection 16 on testing device 10 as shown in FIG. 1 with testing device 10 in full view of the user. With device 10 so connected, the (red) emergency dash valve button and (yellow) dash valve button in the tractor cab are then pushed in and air pressure maintained between 90 and 120 psi. Emergency air gauge 13 on testing device 10 should read approximately 120 psi. A visual and audible inspection of the tractor pneumatic lines and valves can then be made with repairs and replacements if any are found leaking, damaged or frayed. Next, the tractor foot brake is applied and application gauge 14 is viewed. When the foot brake is fully depressed, pressure on gauge 14 should rise immediately to approximately 120 psi and when the foot brake is released, the pressure should drop immediately. Next, check hand valve operation andsfor air leaks, with the (red) trailer emergency valve remaining in, the hand brake valve (not shown) is operated and application gauge 14 on testing device 10 is read. It should rise to approximately 120 psi and release instantly as the hand brake valve is released. With the hand brake "on" a complete visual and audible inspection of the pneumatic lines should again be carried out with any repairs and replacements made as before. Elongated pedal pushing device 65 as shown in FIG. 5 can then be wedged between the seat or some other stable object in the tractor cab and the brake pedal to hold the brake pedal depressed. The tractor pneumatic system should then be visually and audibly inspected and as before any damaged, frayed or leaking valves or lines repaired or replaced. Next, with the (red) emergency valve depressed and the pressure near 120 psi on gauge 13, the tractor protection valve is checked by rotating check valve 17. When opened gauge 13 should drop immediately to zero psi, demonstrating that the tractor protection valve is properly working. The red emergency valve on dash should pop out at approximately 45 psi. The same test procedures can also be carried out on a tandem type trailer pneumatically connected to the tractor from the rear emergency air hook up as normally provided.

The illustrations and examples provided herein are for explanatory purposes and are not intended to limit the scope of the appended claims.

I claim:

1. A device to test a vehicle's electrical and pneumatic systems comprising::
    (a) a housing;
    (b) electrical circuitry contained within said housing;
    (c) first and second pneumatic inlets, each for connection to a vehicle's pneumatic output lines, said first and second pneumatic inlets attached to said housing;
    (d) first and second pneumatic gauges, said first and second pneumatic gauges attached to said housing, said electrical circuitry and to said first and second pneumatic inlets respectively; and
    (e) a plurality of visual indicators, said visual indicators affixed to said housing and connected to said electrical circuitry whereby a vehicle's electric output line can be connected to said electrical circuitry within said housing and said vehicle's pneumatic output lines can be joined to said first and second pneumatic inlets to test the vehicle's pneumatic and electric output.

2. The device of claim 1 whereby said visual indicators are illuminated by electricity from said vehicle's electric output line.

3. The device of claim 1 whereby said first and second pneumatic gauges display the pneumatic pressure of said vehicle's pneumatic output.

4. The device of claim 1 and including a pair of battery connectors, said battery connectors attached to said housing and joined to said electrical circuitry, an electrical outlet, said electrical outlet attached to said housing and joined to said electrical circuitry.

5. The device of claim 1 and including an electrical inlet connection, said electrical inlet connection affixed to said housing and connected to said electrical circuitry whereby said vehicle's electric output line can be connected to said electrical circuitry through said electrical inlet connection.

6. The device of claim 1 wherein said first pneumatic inlet includes a pneumatic check valve.

7. The device of claim 4 wherein said electrical circuitry joined to said electrical outlet includes a flasher circuit.

8. A device to test electrical and pneumatic vehicle systems comprising:
    (a) a housing;
    (b) electrical circuitry contained within said housing;
    (c) first and second pneumatic inlets, each pneumatic inlet for connection to a vehicle's pneumatic output lines, said first and second pneumatic inlets attached to said housing;
    (d) first and second pneumatic gauges, said first and second pneumatic gauges attached to said housing, said electrical circuitry and to said first and second pneumatic inlets respectively;
    (e) a plurality of visual indicators, said visual indicators affixed to said housing and connected to said electrical circuitry; and
    (f) an electrical inlet connection, said electrical inlet connection attached to said housing and in electrical communication with said electrical circuitry whereby a vehicle's electric output line can be connected to said electrical circuitry within said housing through said electrical inlet connection and a vehicle's pneumatic output lines can be joined to said first and second pneumatic inlets to test the vehicle's pneumatic and electric output.

9. A method of testing electrical circuitry of a tractor of a conventional tractor-trailer vehicle having an electrical output line electrically connected to turn signals, auxiliary, clearance and tail light switches, and a brake pedal, using testing apparatus having an electrical inlet connection electrically joined to visual indicators comprising the steps of:

(a) connecting said tractor's electrical output line to said testing apparatus' electrical inlet connection;
(b) turning on the tractor turn signal switch;
(c) observing the flashing indicator of the testing apparatus;
(d) pressing the brake pedal of the tractor;
(e) observing the stop light visual indicator of the testing apparatus;
(f) turning on the trailer auxiliary lights of the tractor;
(g) observing the auxiliary light visual indicator of the testing apparatus;
(h) turning on the tail light switch of the tractor;
(i) observing the tail light visual indicator of the testing apparatus;
(j) turning on the clearance lights switch of the tractor; and
(k) observing the clearance light visual indicator of the testing apparatus.

10. The method of claim 9 wherein the step of pressing the comprises pressing the brake pedal with an elongated brake pedal member.

11. The method of claim 9 wherein the step of turning on the tractor turn signal switch comprises turning on the turn signal switch from inside the tractor.

12. The method of claim 9 including the step of positioning said apparatus whereby said visual indicators can be observed from inside the tractor.

13. A method of testing a pneumatic system of a tractor having pneumatic brake and emergency brake valves, a brake pedal, pneumatic brake circuitry and pneumatic output lines with pneumatic testing apparatus having pneumatic gauges, a first pneumatic inlet having a pneumatic check valve, a second pneumatic inlet, and visual indicators comprising the steps of:

(a) attaching the pneumatic output lines of a tractor to the first and second pneumatic inlets of the testing apparatus;
(b) pressing the brake valve and emergency brake valve on a tractor;
(c) depressing the brake pedal of the tractor; and
(d) observing the pneumatic gauges of the testing apparatus.

14. The method of claim 13 and including the step of opening the check valve of said first pneumatic inlet to simulate a rupture in said pneumatic output line attached to said first pneumatic inlet.

15. The method of claim 13 and including the step of visually and audibly inspecting the pneumatic brake system with the brake pedal depressed.

16. The method of claim 13 wherein the step of depressing the brake pedal comprises depressing the brake pedal with an adjustable elongated member.

17. A device to maintain a vehicle pedal in a depressed posture comprising: a first end support, a first tubular member, said first support pivotally joined to one end of said first tubular member, a second tubular member, a second end support, said second end support pivotally joined to one end of said second tubular member, and said second tubular member slidably positioned within said first tubular member wherein said first tubular member defines a plurality of adjustment apertures.

18. The device of claim 17 and including a lock pin, said lock pin mounted on said second tubular member for selectively engaging said apertures of first tubular member.

19. The device of claim 17 and including a friction producing surface, said friction producing surface attached to said first end support.

20. The device of claim 17 and including a friction producing surface, said friction producing surface attached to said second end support.

21. A device to maintain a vehicle pedal in a depressed posture comprising: a first support, a first elongated member, said first support pivotally joined to one end of said first elongated member, a second elongated member, a second end support, said second end support pivotally joined to one end of said second elongated member, the other end of said second elongated member slidably positioned within the other end of said first elongated member, said first elongated member defining a plurality of apertures, a lock pin, said lock pin mounted on said second elongated member, said lock pin for selective engagement with said first elongated member apertures, and a friction producing surface, said friction producing surface attached to said first end support.

* * * * *